(12) United States Patent
Jo et al.

(10) Patent No.: US 12,249,968 B2
(45) Date of Patent: Mar. 11, 2025

(54) METHOD AND SYSTEM FOR NORMALIZING PLATFORM-ADAPTIVE AUDIO

(71) Applicants: NAVER CORPORATION, Seongnam-si (KR); GAUDIO LAB, INC., Seoul (KR)

(72) Inventors: Seongcheol Jo, Seongnam-si (KR); Taek Su An, Seongnam-si (KR); Sung Hyun Kang, Seongnam-si (KR); JiUng Lee, Seongnam-si (KR); Byung Gyou Choi, Seongnam-si (KR); Jeongsoo Hur, Seongnam-si (KR); Hyung Oh Oh, Seongnam-si (KR); Taegyu Lee, Seoul (KR); Hyeonsu Seo, Seoul (KR)

(73) Assignees: NAVER CORPORATION, Seongnam-si (KR); GAUDIO LAB, INC., Seoul (KR)

( * ) Notice: Subject to any disclaimer, the term of this patent is extended or adjusted under 35 U.S.C. 154(b) by 369 days.

(21) Appl. No.: 17/806,380

(22) Filed: Jun. 10, 2022

(65) Prior Publication Data
US 2022/0302892 A1 Sep. 22, 2022

Related U.S. Application Data (63) Continuation of application No. PCT/KR2020/018151, filed on Dec. 11, 2020.

(30) Foreign Application Priority Data

Dec. 11, 2019 (KR) .................. 10-2019-0164787

(51) Int. Cl.
*H03G 7/00* (2006.01)
*G10L 21/0364* (2013.01)
(Continued)

(52) U.S. Cl.
CPC ......... *H03G 7/007* (2013.01); *G10L 21/0364* (2013.01); *H04L 1/0014* (2013.01); *H04L 65/756* (2022.05)

(58) Field of Classification Search
CPC . H03G 7/007; G10L 21/0364; G10L 21/0316; H04L 1/0014; H04L 65/756;
(Continued)

(56) References Cited

U.S. PATENT DOCUMENTS

2015/0146886 A1\* 5/2015 Baumgarte .......... H03G 3/3089
381/107

FOREIGN PATENT DOCUMENTS

| KR | 1020050021700 A | 3/2005 |
|----|-----------------|--------|
| KR | 1020050048103 A | 5/2005 |

(Continued)

OTHER PUBLICATIONS

ISR issued in PCT/KR2020/018151, mailed Mar. 15, 2021.

*Primary Examiner* — Yosef K Laekemariam
(74) *Attorney, Agent, or Firm* — Greer Burns & Crain Ltd.

(57) ABSTRACT

A method for normalizing platform-adaptive audio includes encoding input video content and generating video stream data as original data to store the video stream data in storage; generating loudness metadata for audio data of the video content and storing the loudness metadata in the storage; receiving a request for the video content from a client; searching the storage for video stream data of the video content corresponding to the request, the loudness metadata, and a device profile corresponding to device information included in the request; and transmitting, to the client, a response including the video stream data, the loudness metadata, and the device profile that are found in the storage.

13 Claims, 9 Drawing Sheets

(51) Int. Cl.
H04L 1/00 (2006.01)
H04L 65/756 (2022.01)

(58) Field of Classification Search
CPC ....... H04L 65/75; H04R 3/00; H04R 2430/01; H04N 21/232; H04N 21/434; H04N 21/439; H04N 21/4394; H04N 21/4341; H04S 7/30
See application file for complete search history.

(56) References Cited

FOREIGN PATENT DOCUMENTS

| | | | |
|---|---|---|---|
| KR | 1020060073318 | A | 6/2006 |
| KR | 1020130060334 | A | 6/2013 |
| KR | 101528991 | B1 | 6/2015 |
| KR | 1020150099586 | A | 8/2015 |
| KR | 1020160083675 | A | 7/2016 |

* cited by examiner

METHOD AND SYSTEM FOR NORMALIZING PLATFORM-ADAPTIVE AUDIO

CROSS-REFERENCE TO RELATED APPLICATIONS

This is a continuation application of International Application No. PCT/KR2020/018151, filed Dec. 11, 2020, which claims the benefit of Korean Patent Application No. 10-2019-0164787, filed Dec. 11, 2019.

BACKGROUND OF THE INVENTION

Field of Invention

One or more example embodiments of the present invention in the following description relate to a method and system for platform adaptive audio normalization.

Description of Related Art

There are services (e.g., a service for streaming of music, video, etc.) for receiving and enjoying contents including audio through a network. For example, Korean Patent Laid-Open Publication No. 10-2016-0083675 relates to a method of providing live streaming content and describes that live streaming content may be more quickly provided without a delay by caching remaining chunk files excluding a first chunk file from live streaming content including a plurality of chunk files before a terminal requests the same.

Here, a difference in volume may be present between different contents. For example, after enjoying first content to which loudness of a first magnitude is set, second content to which loudness of a second magnitude is set may be played back. In this case, if the second magnitude is relatively too large or too small compared to the first magnitude, it may be inconvenient for the user to have to adjust the volume again or the user may feel discomfort due to the volume being too loud (or too low). That is, the difference in volume between the contents may cause the user to perceive degradation in quality of service.

As described above, technology called an audio normalization may be used to reduce a volume gap between contents with a great difference in volume in playing back consecutive contents and to prevent a user from perceiving degradation in quality of content appreciation due to discomfort and excessively high/low volume accordingly.

However, since an audio normalization according to the related art employs a scheme of readjusting an audio loudness of content and overlaying the same on content (a scheme of adjusting a loudness in transcoding of content), a damage to the existing content occurs. Whenever the level of audio normalization is changed, the audio loudness needs to be readjusted and overlaid on content.

In addition, in the case of processing the audio normalization in a uniform manner while ignoring a characteristic of a playback device in which content is played back, if the same content is played back in different devices, the same data may be delivered to each corresponding output device, but a user may have a different audio playback experience. This is not suitable for users that consume contents through various playback devices such as a personal computer (PC) and a mobile device.

BRIEF SUMMARY OF THE INVENTION

Some example embodiments provide a platform adaptive audio normalization method and system that may provide an audio normalization experience optimized for a content playback environment of a user.

According to at least one example embodiment, there is provided a platform adaptive audio normalization method of a computer device including at least one processor, the platform adaptive audio normalization method including encoding, by the at least one processor, input video content, generating video stream data as original data, and storing the video stream data in a storage; generating, by the at least one processor, loudness metadata for audio data of the video content and storing the loudness metadata in the storage; receiving, by the at least one processor, a request for the video content from a client; retrieving, by the at least one processor, the video stream data of the video content corresponding to the request, the loudness metadata, and a device profile corresponding to device information included in the request from the storage; and transmitting, by the at least one processor, a response that includes the video stream data, the loudness metadata, and the device profile retrieved from the storage to the client.

According to an aspect of the invention, the device profile may include an adjustment value that adjusts a normalization factor by analyzing at least one of a number, positions, and distances of audio output devices of a playback device based on audio that is output through the playback device for playing back the video content and is input at a preset playback position.

According to another aspect, the device profile may include an adjustment value that adjusts a normalization factor by analyzing an output and an impedance in an audio output device of a playback device for playing back the video content.

According to still another aspect, the device profile may include an adjustment value that adjusts a normalization factor by statically analyzing hardware property provided by a manufacturer of a playback device for playing back the video content.

According to still another aspect, the platform adaptive audio normalization method may further include optimizing, by the at least one processor, the loudness metadata according to the device profile. The transmitting of the response to the client may include transmitting, to the client, the response that includes the video stream data, the optimized loudness metadata, and the device profile retrieved from the storage.

According to still another aspect, the transmitting of the response to the client may include transmitting, to the client, the response that further includes a value of an audio normalization mode desired to recommend to the client according to the device profile.

According to at least one example embodiment, there is provided a platform adaptive audio normalization method of a computer device including at least one processor, the platform adaptive audio normalization method including collecting, by the at least one processor, device information of the computer device; transmitting, by the at least one processor, a request for video content to a server with the collected device information; receiving, by the at least one processor, a response that includes video stream data corresponding to the video content, loudness metadata for audio data of the video content, and a device profile corresponding to the device information from the server; and processing, by the at least one processor, an audio normalization for the video content using the device profile and the loudness metadata at a playback point time of the video content using the video stream data.

According to an aspect of the invention, the device information may include at least one of a model name, an OS type, an OS version, and a browser version of the computer device.

According to another aspect, the receiving of the response may include receiving, from the server, the response that further includes an audio normalization mode value to recommend according to the device profile, and the processing of the audio normalization may include determining a final audio normalization mode based on the audio normalization mode value; and processing the audio normalization in the final audio normalization mode using the device profile and the loudness metadata.

According to still another aspect, the platform adaptive audio normalization method may further include setting, by the at least one processor, an audio normalization mode. The determining of the final audio normalization mode may include determining the final audio normalization mode by referring to the set audio normalization mode based on the audio normalization mode value.

According to still another aspect, the setting of the audio normalization mode may include setting the audio normalization mode according to a support range in the computer device of a WebAudio API that represents a collection of interfaces related to audio among HTML5 APIs.

According to still another aspect, the support range of the WebAudio API may be determined depending on whether a WebAudio API is supported, whether a web assembly is supported, whether an audio worklet API is supported, and whether a gainNode API is supported.

According to at least one example embodiment, there is provided a computer-readable recording medium storing a computer program to perform the platform adaptive audio normalization method in a computer device.

According to at least one example embodiment, there is provided a computer device including at least one processor configured to execute a computer-readable instruction. The at least one processor is configured to encode input video content, generate video stream data as original data, and store the video stream data in a storage, to generate loudness metadata for audio data of the video content and store the loudness metadata in the storage, to receive a request for the video content from a client, to retrieve the video stream data of the video content corresponding to the request, the loudness metadata, and a device profile corresponding to device information included in the request from the storage, and to transmit a response that includes the video stream data, the loudness metadata, and the device profile retrieved from the storage to the client.

According to at least one example embodiment, there is provided a computer device including at least one processor. The at least one processor is configured to collect device information of the computer device, to transmit a request for video content to a server with the collected device information, to receive a response that includes video stream data corresponding to the video content, loudness metadata for audio data of the video content, and a device profile corresponding to the device information from the server, and to process an audio normalization for the video content using the device profile and the loudness metadata at a playback point time of the video content using the video stream data.

According to some example embodiments, it is possible to provide an audio normalization experience optimized for a content playback environment of a user.

DETAILED DESCRIPTION OF THE INVENTION

Hereinafter, some example embodiments will be described with reference to the accompanying drawings.

A platform adaptive audio normalization system according to the example embodiments may be implemented by a plurality of computer devices and a platform adaptive audio normalization method according to the example embodiments may be performed by at least one computer device included in the platform adaptive audio normalization system. Here, a computer program according to an example embodiment may be installed and executed on the computer device, and the computer device may perform the platform adaptive audio normalization method according to the example embodiments under the control of the executed computer program. The aforementioned computer program may be stored in a computer-readable storage medium to computer-implement the method in conjunction with the computer device.

Figure 1:
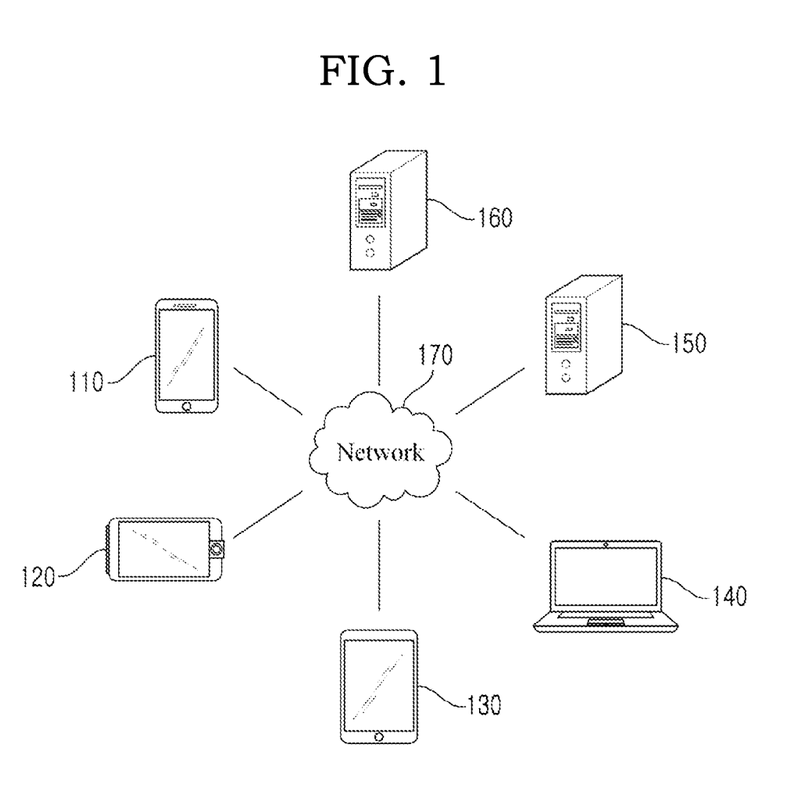
FIG. 1 is a diagram illustrating an example of a network environment according to an example embodiment.

FIG. 1 illustrates an example of a network environment according to an example embodiment. Referring to FIG. 1, the network environment may include a plurality of electronic devices 110, 120, 130, and 140, a plurality of servers 150 and 160, and a network 170. FIG. 1 is provided as an example only. The number of electronic devices or the number of servers is not limited thereto. Also, the network environment of FIG. 1 is provided as an example only among environments applicable to the example embodiments and the environment applicable to the example embodiments is not limited to the network environment of FIG. 1.

Each of the plurality of electronic devices 110, 120, 130, and 140 may be a fixed terminal or a mobile terminal that is configured as a computer device. For example, the plurality of electronic devices 110, 120, 130, and 140 may be a smartphone, a mobile phone, a navigation device, a computer, a laptop computer, a digital broadcasting terminal, a personal digital assistant (PDA), a portable multimedia player (PMP), a tablet personal computer (PC), and the like. For example, although FIG. 1 illustrates a shape of a smartphone as an example of the electronic device 110, the electronic device 110 used herein may refer to one of various types of physical computer devices capable of communicating with other electronic devices 120, 130, and 140 and/or the servers 150 and 160 over the network 170 in a wireless or wired communication manner.

The communication scheme is not limited and may include a near field wireless communication scheme between devices as well as a communication scheme using a communication network (e.g., a mobile communication network, wired Internet, wireless Internet, and a broadcasting network) includable in the network 170. For example, the network 170 may include at least one of network topologies that include a personal area network (PAN), a local area network (LAN), a campus area network (CAN), a metropolitan area network (MAN), a wide area network (WAN), a broadband network (BBN), and the Internet. Also, the network 170 may include at least one of network topologies that include a bus network, a star network, a ring network, a mesh network, a star-bus network, a tree or hierarchical network, and the like. However, they are provided as examples only.

Each of the servers 150 and 160 may be configured as a computer device or a plurality of computer devices that provides an instruction, a code, a file, content, a service, etc., through communication with the plurality of electronic devices 110, 120, 130, and 140 over the network 170. For example, the server 150 may be a system that provides a service (e.g., a group call service (or an audio conference service), a messaging service, a mail service, a social network service, a map service, a translation service, a financial service, a payment service, a search service, a content providing service, etc.) to the plurality of electronic devices 110, 120, 130, and 140 connected over the network 170.

Figure 2:
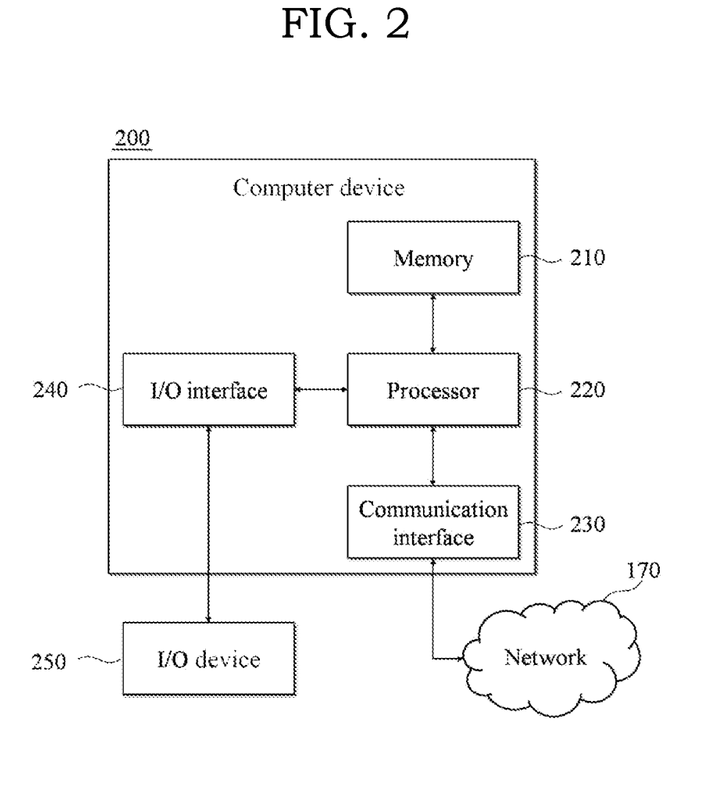
FIG. 2 is a diagram illustrating an example of a computer device according to an example embodiment.

FIG. 2 is a block diagram illustrating an example of a computer device according to an example embodiment. Each of the plurality of electronic devices 110, 120, 130, and 140 of FIG. 1 or each of the servers 150 and 160 may be implemented by a computer device 200 of FIG. 2.

Referring to FIG. 2, the computer device 200 may include a memory 210, a processor 220, a communication interface 230, and an input/output (I/O) interface 240. The memory 210 may include a permanent mass storage device, such as a random access memory (RAM), a read only memory (ROM), and a disk drive, as a computer-readable recording medium. A permanent mass storage device, such as ROM and a disk drive, may be included in the computer device 200 separate from the memory 210. Also, an OS and at least one program code may be stored in the memory 210. Such software components may be loaded to the memory 210 from another computer-readable recording medium separate from the memory 210. The other computer-readable recording medium may include a computer-readable recording medium, for example, a floppy drive, a disk, a tape, a DVD/CD-ROM drive, a memory card, etc. According to other example embodiments, software components may be loaded to the memory 210 through the communication interface 230, instead of the computer-readable recording medium. For example, the software components may be loaded to the memory 210 of the computer device 200 based on a computer program installed by files received over the network 170.

The processor 220 may be configured to process instructions of a computer program by performing basic arithmetic operations, logic operations, and I/O operations. The instructions may be provided from the memory 210 or the communication interface 230 to the processor 220. For example, the processor 220 may be configured to execute received instructions in response to the program code stored in the storage device, such as the memory 210.

The communication interface 230 may provide a function for communication between the communication apparatus 200 and another apparatus (e.g., the aforementioned storage devices) over the network 170. For example, the processor 220 of the computer device 200 may deliver a request or an instruction created based on a program code stored in the storage device such as the memory 210, data, and a file, to other apparatuses over the network 170 under the control of the communication interface 230. Inversely, a signal, an instruction, data, a file, etc., from another apparatus may be received at the computer device 200 through the network 170 and the communication interface 230 of the computer device 200. For example, a signal, an instruction, data, etc., received through the communication interface 230 may be delivered to the processor 220 or the memory 210, and a file, etc., may be stored in a storage medium (e.g., a permanent storage device) further includable in the computer device 200.

The I/O interface 240 may be a device used for interfacing with an I/O device 250. For example, an input device of the I/O device 250 may include a device, such as a microphone, a keyboard, a mouse, etc., and an output device of the I/O device 250 may include a device, such as a display, a speaker, etc. As another example, the I/O interface 240 may be a device for interfacing with an apparatus in which an input function and an output function are integrated into a single function, such as a touchscreen. The I/O device 250 may be configured as a single apparatus with the computer device 200.

Also, according to other example embodiments, the computer device 200 may include greater or less number of components than the number of components shown in FIG. 2. For example, the computer device 200 may include at least a portion of the I/O device 250, or may further include other components, for example, a transceiver, a database, etc.

Figure 3:
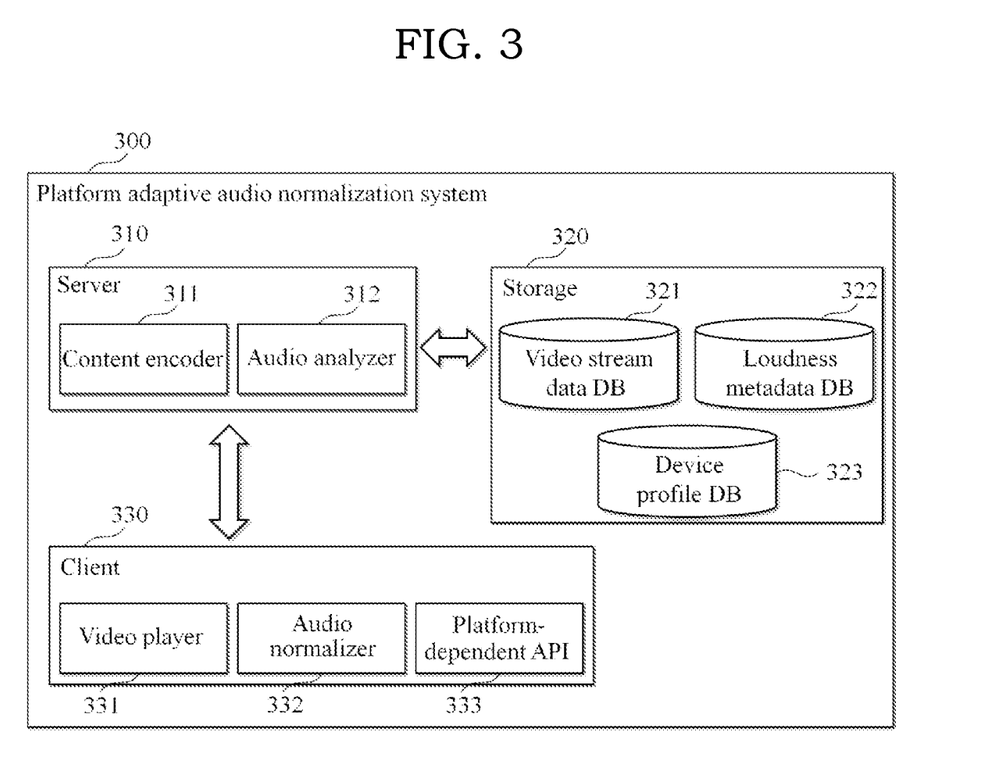
FIG. 3 illustrates an example of a platform adaptive audio normalization system according to an example embodiment.

FIG. 3 illustrates an example of a platform adaptive audio normalization system according to an example embodiment. A platform adaptive audio normalization system 300 according to an example embodiment of FIG. 3 may include a server 310, a storage 320, and a client 330. Here, the storage 320 may be included in a physical device that implements the server 310 and also may be implemented in a form of a separate device that communicates with the server 310 over the network 170. For example, each of the server 310, the storage 320, and the client 330 may be separately implemented in the computer device 200, or the server 310 and the storage 320 may be included together in the computer device 200.

The server 310 may store data (hereinafter, 'loudness metadata') acquired by receiving video content and analyzing a video stream and an audio loudness in the storage 320. To this end, the server 310 may include a content encoder 311 and an audio analyzer 312. Here, the content encoder 311 and the audio analyzer 312 may be functional expressions of operations performed by the processor 220 of the computer device 200 according to a computer program. When the video content is input to the server 310, the content encoder 311 may encode the video content and may generate video stream data. Here, the video stream data may be in a form of original data that includes audio data for the video content. Also, the content encoder 311 may store the generated video stream data in the storage 320. Meanwhile, the content encoder 311 may extract separate audio stream data from the video content and may deliver the audio stream data to the audio analyzer 312.

The audio analyzer 312 may analyze audio data of the video content from the delivered audio stream data and may extract loudness metadata for the entire single piece of video content. The extracted loudness metadata may also be stored in the storage 320.

The storage 320 may include a video stream data database (DB) 321, a loudness metadata DB 322, and a device profile DB 323.

The video stream data of the video content delivered from the server 310 or the content encoder 311 may be stored in the video stream data DB 321. For example, an identifier of the video content and the video stream data of the corresponding video content may be stored in the video stream data DB 321 in association with each other.

The loudness metadata delivered from the server 310 or the audio analyzer 312 may be stored in the loudness metadata DB 322. For example, the identifier of the video content and the loudness metadata of the corresponding video content may be stored in association with each other.

Property information on audio hardware of a playback device that plays back video content may be stored in the device profile DB 323. For example, property information on audio hardware in which each of various playback devices capable of playing back the video content is analyzed in advance may be stored in the device profile DB 323.

Meanwhile, the client 330 may receive the video stream data of the video content and the loudness metadata from the server 310 and may perform client-side audio normalization at a playback point in time of the video content. Audio normalization may refer to a process of reducing the size deviation of audio output over individual sections of video content or the entire length of the video content and adjusting the audio output to have a constant output value. To this end, the client 330 may include a video player 331, an audio normalizer 332, and a platform-dependent application programming interface (API) 333. Here, the video player 331 may be a software module, and the playback device may be an audio hardware module.

The video player 331 may deliver the audio data included in the video stream data and the loudness metadata to the audio normalizer 332 while receiving and playing back the video stream data and the loudness metadata for the corresponding video content from the server 310 in response to a video content request from the user.

In this case, the audio normalizer 332 may perform client-side audio normalization based on the loudness metadata and a device profile using the platform-dependent API 333. Further description related to the platform-dependent API 333 is made below.

Figure 4:
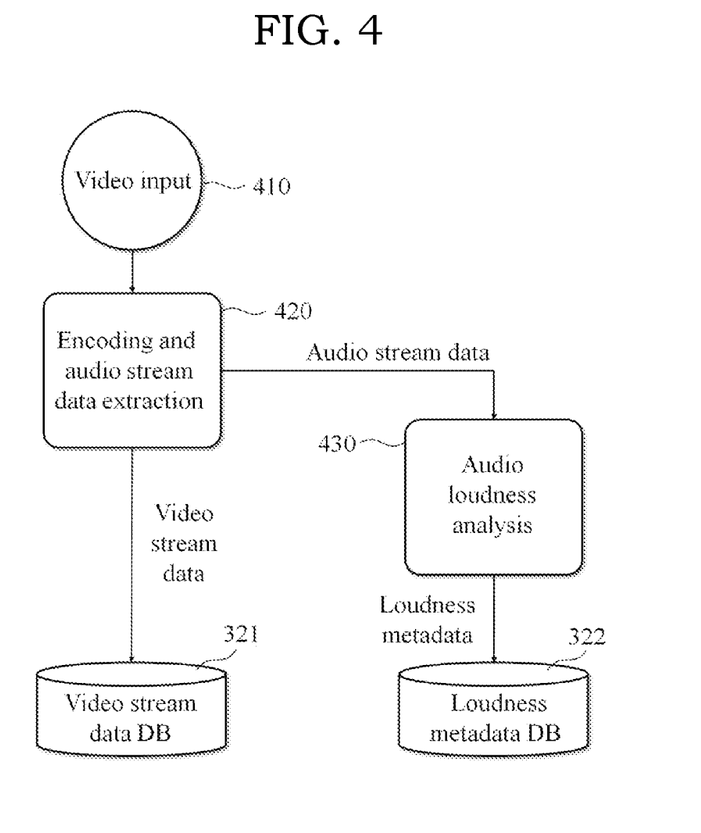
FIG. 4 illustrates an example of a process of generating loudness metadata on a server side according to an example embodiment.

FIG. 4 illustrates an example of a process of generating loudness metadata on a server side according to an example embodiment.

Video input 410 may represent an example of a process in which video content is input to the server 310.

Encoding and audio stream data extraction 420 may represent an example of a process in which the content encoder 311 encodes the video content, generates video stream data as original data, stores the video stream data in the video stream data DB 321 of the storage 320, extracts the audio stream data, and delivers the audio stream data to the audio analyzer 312.

Audio loudness analysis 430 may represent an example of a process in which the audio analyzer 312 analyzes the audio stream data, generates the loudness metadata, and stores the loudness metadata in the loudness metadata DB 322 of the storage 320.

Figure 5:
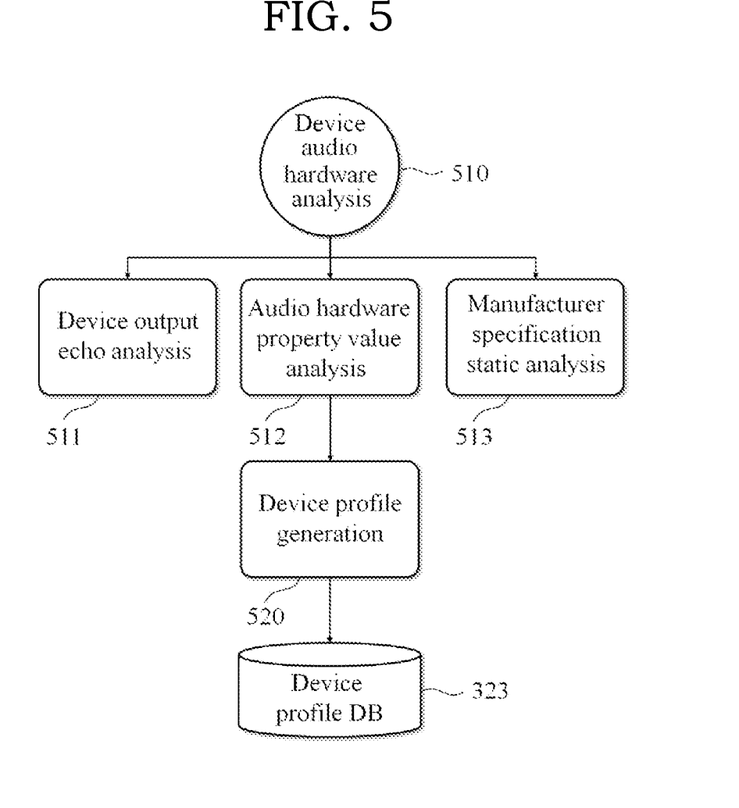
FIG. 5 illustrates an example of a process of generating a device profile by pre-analyzing property of audio hardware of a playback device on a server side according to an example embodiment.

FIG. 5 illustrates an example of a process of generating a device profile by pre-analyzing property of audio hardware of a playback device on a server side according to an example embodiment.

Device audio hardware analysis 510 may represent an example of a process of analyzing in advance an audio hardware property for each playback device to provide an adaptive audio normalization to an individual playback device. The device audio hardware analysis 510 may include device output echo analysis 511, audio hardware property value analysis 512, and manufacturer specification static analysis 513.

Device output echo analysis 511 may represent an example of a process of deriving a first adjustment value that adjusts a normalization factor by analyzing the number, positions, and distances of audio output devices (speakers) of the playback device based on audio that is output through the playback device for playing back the video content and is input at a preset playback position, to meet user playback experience of the playback device.

Audio hardware property value analysis 512 may represent an example of a process of deriving a second adjustment value that adjusts a normalization factor by analyzing an output and an impedance in an audio output device of the playback device.

Manufacturer specification static analysis 513 may be an example of a process of deriving a third adjustment value that adjusts a normalization factor by statically analyzing a hardware property provided by the manufacturer of the playback device for a value that may not be directly measured through an actual playback device.

Device profile generation 520 may represent an example of a process of generating a device profile that includes the first adjustment value, the second adjustment value, and the third adjustment value for the playback device and storing the device profile in the device profile DB 323.

The process of FIG. 5 may be performed for each different model of the playback device. That is, a device profile for each model of the playback device may be acquired from the device profile DB 323.

An example of a process in which the server 310 generates in advance video stream data, loudness metadata, and a device profile for providing of the video content and storing the same in the storage 320 is described with reference to FIGS. 4 and 5. Hereinafter, an example of a process of processing audio normalization for video content that the client 330 desires to play back is described.

The client 330 may generate device information of the playback device in which the client 330 is installed through a browser device API that may be included in the platform-dependent API 333. For example, the client 330 may extract hardware platform information that includes a model name, an operating system (OS) type, an OS version, a browser version, and the like of the playback device and may generate the device information that includes the extracted hardware platform information. The generated device information may also be transmitted when the client 330 requests the server 310 for normalization metadata (e.g., loudness metadata and a device profile) for audio normalization such that the server 310 may deliver normalization metadata suitable for the playback device.

The client 330 may check availability of software. Here, the software may be an app for receiving a service from the server 310 and/or a video player 331. The availability of software may be used to determine an available normalization mode.

Figure 6:
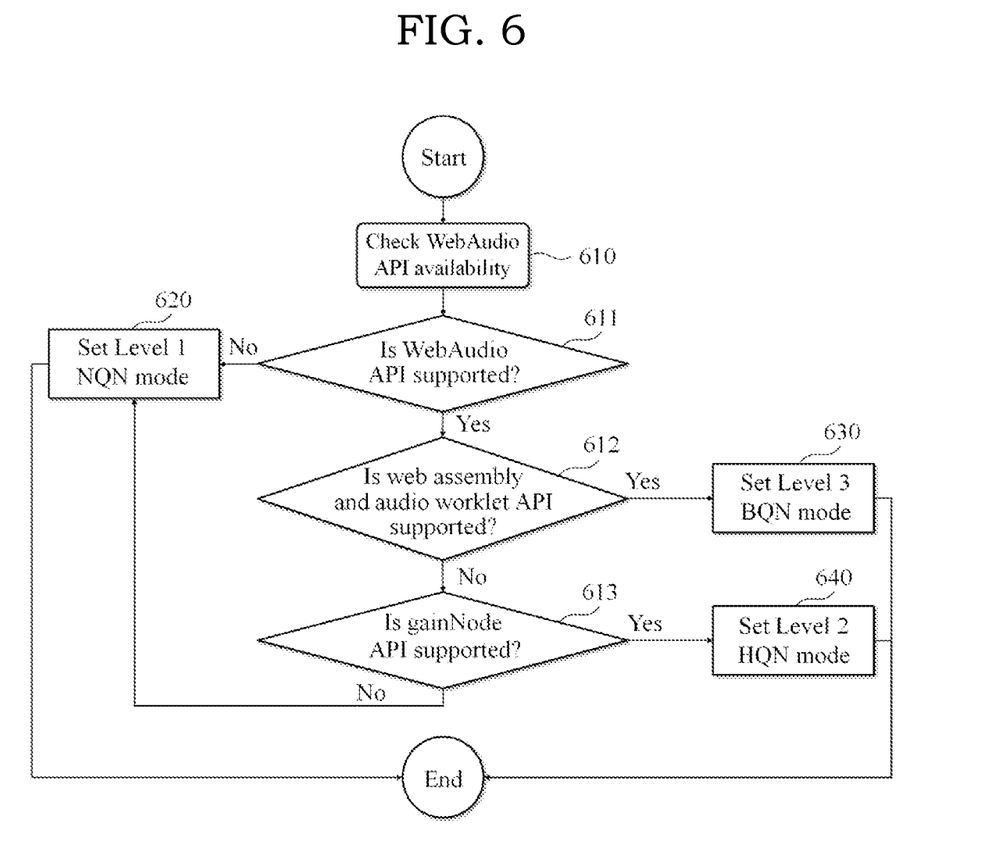
FIG. 6 illustrates an example of a process of determining an available normalization mode based on a WebAudio application programming interface (API) according to an example embodiment.

FIG. 6 illustrates an example of a process of determining an available normalization mode based on a WebAudio API according to an example embodiment. The WebAudio API may be included in the platform-dependent API 333 of FIG. 3.

In first process 610, the client 330 may check WebAudio API availability. For example, in this process, the client 330 may verify the support range of the WebAudio API in the playback device using the WebAudio API. As a detailed example, the client 330 may determine whether the WebAudio API is supported, whether a web assembly is supported, whether an audio worklet API is supported, and whether a gainNode API is supported as the support range of the WebAudio API.

Here, the WebAudio API may refer to a collection of interfaces related to audio among HyperText Markup Language 5 (HTML5) APIs. The HTML5 API may refer to a functional interface of a browser that may be used by playback software (e.g., the client 330) when a user plays back video content through an Internet browser. Also, the web assembly may refer to a low-level language support function for processing a high-level operation that is difficult to process only with the HTML5 API. The web assembly may be essentially used for real-time audio normalization of top quality.

(1-1)st process 611 may be an example of a process in which the client 330 determines whether the WebAudio API is supported. When the WebAudio API is supported, the client 330 may perform (1-2)nd process 612. When the WebAudio API is not supported, the client 330 may set an audio normalization mode to a Level 1 Normal Quality Normalization (NQN) mode by performing second process 620. Here, the Level 1 NQN mode may refer to a level for providing a fixed audio normalization through static volume adjustment.

(1-2)nd process 612 may be an example of a process in which the client 330 determines whether the web assembly and the audio worklet are supported. When all of the web assembly and the audio worklet API are supported following the WebAudio API, the client 330 may set the audio normalization mode to a Level 3 Best Quality Normalization (BQN) model by performing third process 630. Here, the Level 3 BQN mode may refer to a level for providing audio normalization of best quality through real-time audio processing. When neither of the web assembly and the audio worklet API are supported, the client 330 may perform (1-3)rd process 613.

(1-3)rd process 613 may be an example of a process in which the client 330 determines whether the gainNode API is supported. When the gainNode API is supported, the client 330 may set the audio normalization mode to a Level 2 High Quality Normalization (HQN) mode by performing fourth process 640. Here, the Level 2 HQN mode may refer to a level of providing audio normalization of high quality through non-real-time audio processing and dynamic volume adjustment. When the gainNode API is not supported, the client 330 may set the audio normalization mode to the Level 1 NQN mode by performing second process 620.

That is, the audio normalization mode according to supporting of the WebAudio API may be represented as in the following Table 1.

TABLE 1

| WebAudio API | Mode |
|---|---|
| WebAudio API is not supported | Level 1 NQN mode |
| gainNode API is supported, audio worklet API and web assembly are not supported | Level 2 HQN mode |
| audio worklet API and web assembly are supported | Level 3 BQN mode |

Information on the audio normalization mode set by the client 330 may not be delivered to the server 310 and may be used to determine a final audio normalization mode by combining response information from the server 310 to a video content request from the client 330.

The client 330 may transmit a request for the video content to the server 310. Here, the request may include a request for the video content, a request for loudness metadata of the corresponding video content, and the aforementioned device information. Here, the response from the server 310 may include video stream data for the video content, loudness metadata of the corresponding video content, a device profile corresponding to the device information, and an audio normalization mode value recommended by the server 310 according to the device profile.

Figure 7:
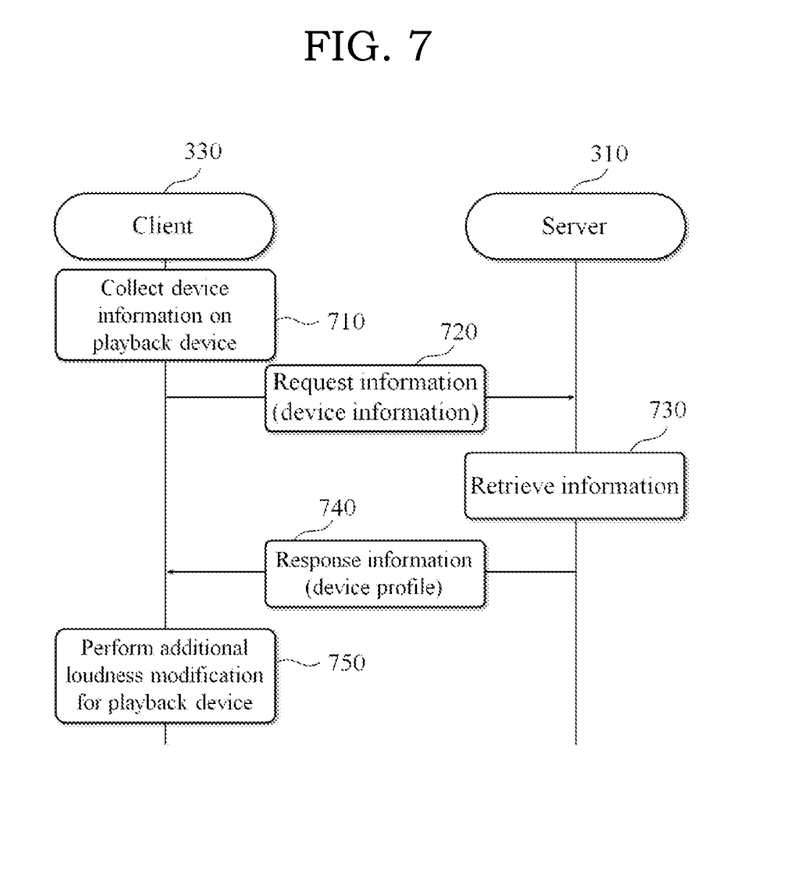
FIG. 7 illustrates a process of transmitting a request for video content from a client side to a server side and receiving a response to the request according to an example embodiment.

FIG. 7 illustrates a process of transmitting a request for video content from a client side to a server side and receiving a response to the request according to an example embodiment.

In first process 710, the client 330 may collect device information on a playback device. As explained, the video player 331 may be a software module, and the playback device may be an audio hardware module. As described above, the device information may include information of a model name, an OS type, an OS version, and a browser version of the playback device.

In second process 720, the client 330 may transmit request information to the server 310. For example, the request information may include information for requesting specific video content and loudness metadata for the corresponding video content and may further include device information.

In third process 730, the server 310 may retrieve information corresponding to the request from the client 330. Here, the server 310 may retrieve video stream data of the video content from the video stream data DB 321 of the storage 320 according to request information and may retrieve the loudness metadata of the corresponding video content from the loudness metadata DB 322 of the storage 320. Also, the server 310 may retrieve a device profile corresponding to the received device information from the device profile DB 323 of the storage 320. The device profile may include adjustment values that adjust a normalization factor, acquired through the device output echo analysis 511, the audio hardware property value analysis 512, and the manufacturer specification static analysis 513 of FIG. 5, for each model of the playback device.

In fourth process 740, the server 320 may transmit the response information retrieved in response to the request information to the client 330. The response information may include the video stream data, the loudness metadata, and the device profile retrieved in third process 730. Also, depending on example embodiments, the server 310 may modify the loudness metadata to be optimized for the device profile, may include the modified loudness metadata in the response information, and may provide the same to the client 330. Also, the server 310 may further provide, to the client 330, a value of an audio normalization mode recommended according to the device profile.

In fifth process 750, the client 330 may perform additional loudness modification for the playback device. For example, when the device profile is included in the response information, the client 330 may perform the additional loudness modification based on the device profile. On the contrary, when the device profile corresponding to the playback device in which the client 330 is installed is absent in the device profile DB 323, the client 330 may not acquire the device profile. In this case, the client 330 may perform a general audio normalization process without performing the additional loudness modification. As already explained, audio normalization may refer to a process of reducing the size deviation of audio output over individual sections of video content or the entire length of the video content and adjusting the audio output to have a constant output value.

Also, the client 330 may determine a final audio normalization mode in combination with availability of a device based on the value of the audio normalization mode delivered from the server 310. For example, the client 330 may determine the final audio normalization mode using whether loudness metadata is delivered, whether the server 310 is available, whether the client 330 is available, and whether normalization is available. In this case, the audio normalization mode determined through FIG. 6 may be referred to.

Also, the client 330 may perform the audio normalization in the final audio normalization mode using the device profile and the loudness metadata included in the response information.

Figure 8:
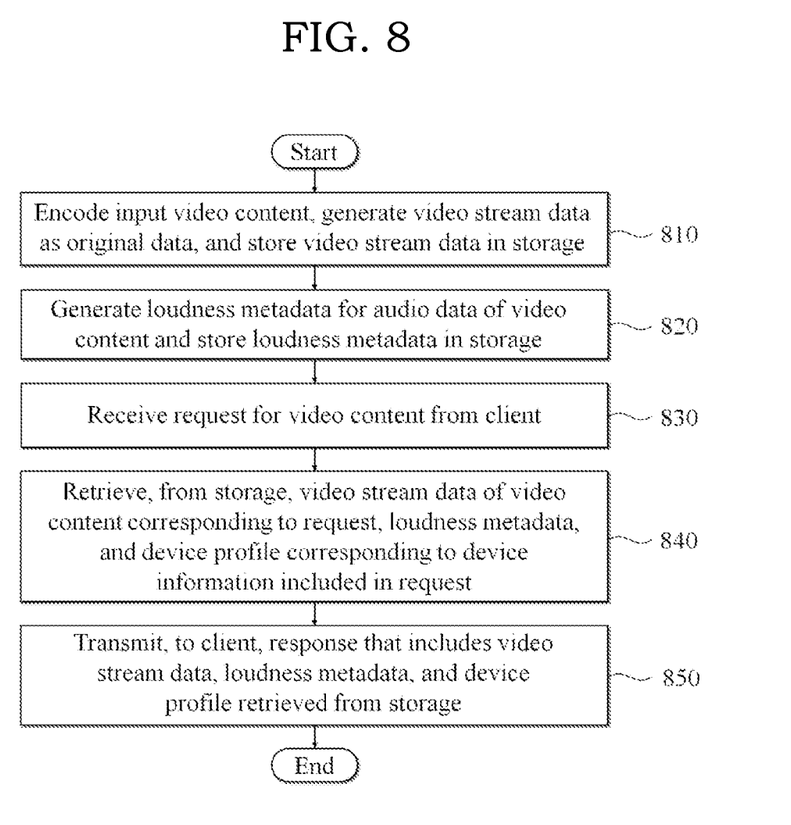
FIG. 8 is a flowchart illustrating an example of a platform adaptive audio normalization method of a server according to an example embodiment.

FIG. 8 is a flowchart illustrating an example of a platform adaptive audio normalization method of a server according to an example embodiment. The platform adaptive audio normalization method according to the example embodiment may be performed by the computer device 200 that implements the server 310. In this case, the processor 220 of the computer device 200 may be implemented to execute a control instruction according to a code of at least one computer program or a code of an OS included in the memory 210. Here, the processor 220 may control the computer device 200 to perform operations 810 to 850 included in the method of FIG. 8 according to a control instruction provided from a code stored in the computer device 200.

In operation 810, the computer device 200 may encode input video content, may generate video stream data as original data, and may store the video stream data in a storage. Generating and storing the video stream data in the storage is described above in detail with reference to FIG. 4.

In operation 820, the computer device 200 may generate loudness metadata for audio data of the video content and may store the loudness metadata in the storage. Generating and storing the loudness metadata in the storage is also described above in detail with reference to FIG. 4.

In operation 830, the computer device 200 may receive a request for the video content from a client. Here, the client may correspond to the aforementioned client 330 and may transmit a request for video content selected by a user to the server 310. Here, the computer device 200 that implements the server 310 may receive the request for the video content.

In operation 840, the computer device 200 may retrieve, from the storage the video stream data of the video content corresponding to the request, the loudness metadata, and a device profile corresponding to device information included in the request. The video stream data DB 321 of the storage 320 that stores the video stream data, the loudness metadata DB 322 of the storage 320 that stores the loudness metadata, and the device profile DB 323 of the storage 320 that stores the device profile are described above with reference to FIG. 3.

Here, as described above, the device profile may include at least one of a first adjustment value that adjusts a normalization factor by analyzing a number, positions, and distances of audio output devices of the playback device based on audio that is output through the playback device for playing back the video content and is input at a preset playback position, a second adjustment value that adjusts a normalization factor by analyzing an output and an impedance in an audio output device of the playback device for playing back the video content, and a third adjustment value that adjusts a normalization factor by statically analyzing hardware property provided by a manufacturer of the playback device for playing back the video content.

In operation 850, the computer device 200 may transmit, to the client, a response that includes the video stream data, the loudness metadata, and the device profile retrieved from the storage.

Also, depending on example embodiments, the computer device 200 may optimize the loudness metadata according to the device profile. In this case, in operation 850, the computer device 200 may transmit, to the client, the response that includes the video stream data, the optimized loudness metadata, and the device profile retrieved from the storage.

Also, depending on example embodiments, in operation 850, the computer device 200 may further transmit, to the client, a response that further includes a value of an audio normalization mode desired to recommend to the client according to the device profile. In this case, the client may determine a final audio normalization mode based on the audio normalization mode value included in the response.

In this case, the client may process audio normalization in the determined final audio normalization mode using the device profile and the loudness metadata included in the response.

Figure 9:
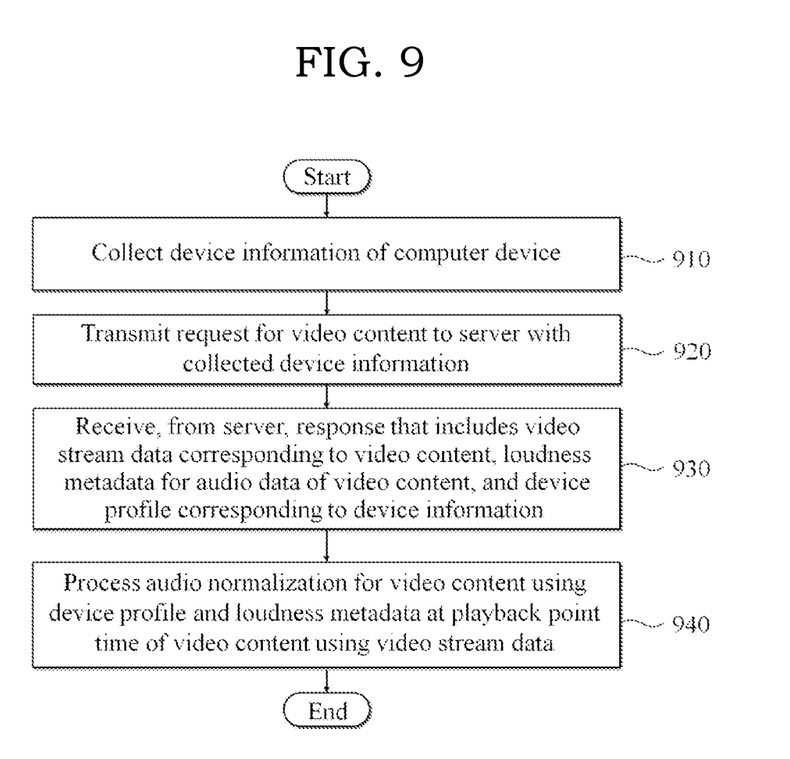
FIG. 9 is a flowchart illustrating an example of a platform adaptive audio normalization method of a client according to an example embodiment.

FIG. 9 is a flowchart illustrating an example of a platform adaptive audio normalization method of a client according to an example embodiment. The platform adaptive audio normalization method according to the example embodiment may be performed by the computer device 200 that implements the client 330. In this case, the processor 220 of the computer device 200 may be implemented to execute a control instruction according to a code of at least one program or a code of an OS included in the memory 210. Here, the processor 220 may control the computer device 200 to perform operations 910 to 940 included in the method of FIG. 9 according to a control instruction provided from a code stored in the computer device 200. Here, the at least one computer program may include an application (e.g., a media player app) configured to receive and play back the video content from the server 310.

In operation 910, the computer device 200 may collect device information of the client 330. For example, the device information may include at least one of a model name, an OS type, an OS version, and a browser version of the client 330.

In operation 920, the computer device 200 may transmit a request for video content to a server with the collected device information. Here, the server may correspond to the aforementioned server 310.

In operation 930, the computer device 200 may receive, from the server, a response that includes video stream data corresponding to the video content, loudness metadata for audio data of the video content, and a device profile corresponding to the device information. The response may correspond to the response transmitted from the computer device 200 that implements the server 310 in operation 850 of FIG. 8.

In operation 940, the computer device 200 may process an audio normalization for the video content using the device profile and the loudness metadata at a playback point time of the video content using the video stream data. Here, since the device profile is applied to the audio normalization and thereby process, the user may have the same audio playback experience for various playback devices of the user.

Depending on example embodiments, the computer device 200 may receive, from the server, the response that further includes an audio normalization mode value recommended according to the device profile in operation 930. In this case, in operation 940, the computer device 200 may determine a final audio normalization mode based on the audio normalization mode value and may process the audio normalization in the final audio normalization mode using the device profile and the loudness metadata. Also, the computer device 200 may directly set the audio normalization mode. In this case, the computer device 200 may determine the final audio normalization mode by referring to the audio normalization mode that is set based on the audio normalization mode value. For example, as described above with reference to FIG. 5, the computer device 200 may set the audio normalization mode based on the support range in the computer device 200 of a WebAudio API that represents a collection of interfaces related to audio among HTML5 APIs. In this case, the support range of the WebAudio API may be determined depending on whether a WebAudio API is supported, whether a web assembly is supported, whether an audio worklet API is supported, and whether a gainNode API is supported. Setting the audio normalization mode according to the support range is described above with reference to FIG. 5 and Table 1.

As described above, according to some example embodiments, it is possible to provide an audio normalization experience optimized for a content playback environment of a user.

The systems or apparatuses described herein may be implemented using hardware components or a combination of hardware components and software components. For example, the apparatuses and the components described herein may be implemented using one or more general-purpose or special purpose computers or processing devices, for example, a processor, a controller, an arithmetic logic unit (ALU), a digital signal processor, a microcomputer, a field programmable gate array (FPGA), a programmable logic unit (PLU), a microprocessor, or any other device capable of responding to and executing instructions in a defined manner. A processing device may run an operating system (OS) and one or more software applications that run on the OS. A processing device also may access, store, manipulate, process, and create data in response to execution of the software. For purpose of simplicity, the description of a processing device is used as singular; however, one skilled in the art will be appreciated that a processing device may include multiple processing elements and/or multiple types of processing elements. For example, a processing device may include multiple processors or a processor and a controller. In addition, different processing configurations are possible, such as parallel processors.

Software may include a computer program, a piece of code, an instruction, or some combinations thereof, for independently or collectively instructing or configuring the processing device to operate as desired. Software and/or data may be embodied in any type of machine, component, physical equipment, virtual equipment, a computer storage medium or device, to be interpreted by the processing device or to provide an instruction or data to the processing device. The software also may be distributed over network coupled computer systems so that the software is stored and executed in a distributed fashion. The software and data may be stored by one or more computer readable storage media.

The methods according to the above-described example embodiments may be configured in a form of program instructions performed through various computer devices and recorded in computer-readable media. The media may include, in combination with program instructions, data files, data structures, and the like. Here, the media may continuously store computer-executable programs or may transitorily store the same for execution or download. Also, the media may be various types of recording devices or storage devices in a form in which one or a plurality of hardware components are combined. Without being limited to media directly connected to a computer system, the media may be distributed over the network. Examples of the media include magnetic media such as hard disks, floppy disks, and magnetic tapes; optical media such as CD-ROM and DVDs; magneto-optical media such as floptical disks; and hardware devices that are configured to store program instructions, such as read-only memory (ROM), random access memory (RAM), flash memory, and the like. Examples of other media may include recording media and storage media managed by an app store that distributes applications or a site that supplies and distributes other various types of software, a server, and the like. Examples of a program instruction include a machine code as produced by a compiler and include a high-language code executable by a computer using an interpreter.

Although the example embodiments are described with reference to some specific example embodiments and accompanying drawings, it will be apparent to one of ordinary skill in the art that various alterations and modifications in form and details may be made in these example embodiments without departing from the spirit and scope of the claims and their equivalents. For example, suitable results may be achieved if the described techniques are performed in different order, and/or if components in a described system, architecture, device, or circuit are combined in a different manner, or replaced or supplemented by other components or their equivalents.

Therefore, other implementations, other example embodiments, and equivalents of the claims are to be construed as being included in the claims.

What is claimed is:

1. A platform adaptive audio normalization method performed by a computer device having at least one processor, the platform adaptive audio normalization method comprising:
   encoding input video content, generating video stream data as original data, and storing the video stream data in a storage;
   generating loudness metadata for audio data of the video content and storing the loudness metadata in the storage;
   retrieving the video stream data of the video content corresponding to a request for the video content received from a client, the loudness metadata, and a device profile corresponding to device information included in the request from the storage; and
   transmitting a response that includes the video stream data, the loudness metadata, and the device profile retrieved from the storage to the client, wherein the device profile includes
a first adjustment value that adjusts a normalization factor by analyzing at least one of a number, positions, and distances of audio output devices of a playback device based on audio that is output through the playback device for playing back the video content and is input at a preset playback position, or
a second adjustment value that adjusts a normalization factor by analyzing an output and an impedance in an audio output device of a playback device for playing back the video content.

2. The platform adaptive audio normalization method of claim 1, wherein the device profile further includes an adjustment value that adjusts the normalization factor by statically analyzing hardware property provided by a manufacturer of the playback device for playing back the video content.

3. The platform adaptive audio normalization method of claim 1, further comprising:
optimizing the loudness metadata according to the device profile, and
transmitting the optimized loudness metadata with the video stream data and the device profile retrieved from the storage in the response to the client.

4. The platform adaptive audio normalization method of claim 1, wherein the response transmitted to the client further includes a value of an audio normalization mode desired to recommend to the client according to the device profile.

5. A platform adaptive audio normalization method performed by a computer device having at least one processor, the platform adaptive audio normalization method comprising:
collecting device information of the computer device;
transmitting a request for video content to a server with the collected device information;
receiving a response that includes video stream data corresponding to the video content, loudness metadata for audio data of the video content, and a device profile corresponding to the device information from the server; and
processing an audio normalization for the video content using the device profile and the loudness metadata at a playback point time of the video content using the video stream data,
wherein the processing of the audio normalization includes determining a final audio normalization mode based on an audio normalization mode value recommended according to the device profile and included in the response from the server, and processing the audio normalization in the final audio normalization mode using the device profile and the loudness metadata.

6. The platform adaptive audio normalization method of claim 5, wherein the device information includes at least one of a model name, an operating system (OS) type, an OS version, and a browser version of the computer device.

7. The platform adaptive audio normalization method of claim 5 further comprising:
setting an audio normalization mode,
wherein the determining the final audio normalization mode includes referring to the set audio normalization mode based on the audio normalization mode value.

8. The platform adaptive audio normalization method of claim 7, wherein the audio normalization mode is set according to a support range in the computer device of a WebAudio application programming interface (API) that represents a collection of interfaces related to audio among HyperText Markup Language 5 (HTML5) APIs.

9. The platform adaptive audio normalization method of claim 8, wherein the support range of the WebAudio API is determined depending on whether a WebAudio API is supported, whether a web assembly is supported, whether an audio worklet API is supported, and whether a gainNode API is supported.

10. A non-transitory computer-readable recording medium storing a computer program for performing the method of claim 1 in a computer device.

11. A computer device comprising:
at least one processor configured to execute a computer-readable instruction,
wherein the at least one processor is configured to,
encode input video content, generate video stream data as original data, and store the video stream data in a storage,
generate loudness metadata for audio data of the video content and store the loudness metadata in the storage,
receive a request for the video content from a client,
retrieve the video stream data of the video content corresponding to the request, the loudness metadata, and a device profile corresponding to device information included in the request from the storage, and
transmit a response that includes the video stream data, the loudness metadata, and the device profile retrieved from the storage to the client,
wherein the device profile includes
a first adjustment value that adjusts a normalization factor by analyzing at least one of a number, positions, and distances of audio output devices of a playback device based on audio that is output through the playback device for playing back the video content and is input at a preset playback position, or
a second adjustment value that adjusts a normalization factor by analyzing an output and an impedance in an audio output device of a playback device for playing back the video content.

12. The computer device of claim 11, wherein the at least one processor is further configured to,
optimize the loudness metadata according to the device profile, and
transmit the optimized loudness metadata with the video stream data, and the device profile retrieved from the storage in the response to the client.

13. The computer device of claim 11, wherein the response to the client further includes a value of an audio normalization mode recommended to the client according to the device profile.

* * * * *

UNITED STATES PATENT AND TRADEMARK OFFICE
CERTIFICATE OF CORRECTION

| | | |
|---|---|---|
| PATENT NO. | : 12,249,968 B2 | Page 1 of 1 |
| APPLICATION NO. | : 17/806380 | |
| DATED | : March 11, 2025 | |
| INVENTOR(S) | : Seongcheol Jo et al. | |

It is certified that error appears in the above-identified patent and that said Letters Patent is hereby corrected as shown below:

On the Title Page

Under (72) Inventors, delete "Hyung Oh Oh" and insert --Hyun Oh Oh-- therefor.

Signed and Sealed this
Tenth Day of June, 2025

Coke Morgan Stewart
*Acting Director of the United States Patent and Trademark Office*